(12) United States Patent
Das et al.

(10) Patent No.: US 7,442,879 B2
(45) Date of Patent: Oct. 28, 2008

(54) CIRCUITIZED SUBSTRATE WITH SOLDER-COATED MICROPARTICLE PASTE CONNECTIONS, MULTILAYERED SUBSTRATE ASSEMBLY, ELECTRICAL ASSEMBLY AND INFORMATION HANDLING SYSTEM UTILIZING SAME AND METHOD OF MAKING SAID SUBSTRATE

(75) Inventors: Rabindra N. Das, Ithaca, NY (US); John M. Lauffer, Waverly, NY (US); Roy H. Magnuson, Endicott, NY (US); Voya R. Markovich, Endwell, NY (US)

(73) Assignee: Endicott Interconect Technologies, Inc., Endicott, NY (US)

( * ) Notice: Subject to any disclaimer, the term of this patent is extended or adjusted under 35 U.S.C. 154(b) by 485 days.

(21) Appl. No.: 11/244,180

(22) Filed: Oct. 6, 2005

(65) Prior Publication Data

US 2007/0007033 A1    Jan. 11, 2007

Related U.S. Application Data

(63) Continuation-in-part of application No. 11/177,442, filed on Jul. 11, 2005, now Pat. No. 7,342,183.

(51) Int. Cl.
*H01R 12/04* (2006.01)
*H05K 1/11* (2006.01)
(52) U.S. Cl. ...................... 174/262; 361/803
(58) Field of Classification Search ......... 174/262–266; 361/803
See application file for complete search history.

(56) References Cited

U.S. PATENT DOCUMENTS

| | | | |
|---|---|---|---|
| 4,775,439 A | 10/1988 | Seeger, Jr. et al. | |
| 5,538,789 A | 7/1996 | Capote et al. | |
| 5,565,267 A | 10/1996 | Capote et al. | |
| 5,882,722 A | 3/1999 | Kydd | |
| 5,891,283 A | 4/1999 | Tani et al. | |
| 6,036,889 A | 3/2000 | Kydd | |
| 6,120,708 A | 9/2000 | Ohshita et al. | |
| 6,623,663 B2 | 9/2003 | Oshita et al. | |
| 6,641,898 B2 | 11/2003 | Yazaki et al. | |
| 6,740,287 B2 | 5/2004 | Billiet et al. | |
| 6,743,319 B2 | 6/2004 | Kydd | |
| 6,762,496 B2 | 7/2004 | Yamamoto et al. | |
| 6,809,269 B2 | 10/2004 | Fuller, Jr. et al. | |
| 6,815,837 B2 | 11/2004 | Alcoe | |
| 6,828,514 B2 | 12/2004 | Chan et al. | |
| 6,867,378 B2 * | 3/2005 | Uchida et al. ............... 174/260 |
| 2005/0023035 A1 * | 2/2005 | Fuller et al. ................. 174/264 |

* cited by examiner

*Primary Examiner*—Jeremy C Norris
(74) *Attorney, Agent, or Firm*—Hinman, Howard & Kattell; Mark Levy; Lawrence R. Fraley

(57) ABSTRACT

A circuitized substrate which includes a conductive paste for providing electrical connections. The paste, in one embodiment, includes a binder component and at least one metallic component including microparticles. In another embodiment, the paste includes the binder and a plurality of nano-wires. Selected ones of the microparticles or nano-wires include a layer of solder thereon. A method of making such a substrate is also provided, as are an electrical assembly and information handling system adapter for having such a substrate as part thereof.

40 Claims, 3 Drawing Sheets

CIRCUITIZED SUBSTRATE WITH SOLDER-COATED MICROPARTICLE PASTE CONNECTIONS, MULTILAYERED SUBSTRATE ASSEMBLY, ELECTRICAL ASSEMBLY AND INFORMATION HANDLING SYSTEM UTILIZING SAME AND METHOD OF MAKING SAID SUBSTRATE

The present application is a continuation-in-part of Ser. No. 11/177,442, filed Jul. 11, 2005, now U.S. Pat. No. 7,342,183.

TECHNICAL FIELD

This invention relates to organic circuitized substrates and particularly to those used in multilayered circuit boards, chip carriers, and the like, and to processes for manufacturing same. More particularly, the invention relates to such substrates in which conductive pastes are used for form electrical connections therein, e.g., between conductors on different conductive layers within the substrate, as well as within conductive thru-holes if so utilized. Even more particularly, the invention relates to such substrates which are comprised of organic materials (dielectrics) compared to non-organic such as those comprised of ceramics.

CROSS REFERENCE TO CO-PENDING APPLICATIONS

In Ser. No. 11/177,442, filed Jul. 11, 2005, there is defined a circuitized substrate which includes a high temperature dielectric material in combination with a low temperature conductive paste, the paste including an organic binder component and at least one metallic component. The flakes of the metallic component are sintered to form a conductive path through the dielectric when the dielectric is used as a layer in the substrate. Ser. No. 11/177,442 is assigned to the same Assignee as the present invention.

In Ser. No. 11/177,413, also filed Jul. 11, 2005, there is defined a method of making a circuitized substrate which includes a high temperature dielectric material in combination with a low temperature conductive paste, the paste including an organic binder component and at least one metallic component. In this method, the flakes of the metallic component are sintered to form a conductive path through the dielectric when the dielectric is used as a layer in the substrate. Ser. No. 11/177,413 is also assigned to the same Assignee as the present invention.

BACKGROUND OF THE INVENTION

To meet today's miniaturization requirements for circuitized substrates, multilayered printed circuit boards (PCBs), laminate chip carriers, and the like organic products require formation of multiple circuits in a minimum volume or space. These typically comprise a stack of electrically conductive layers of signal, ground and/or power planes (lines) separated from each other by a layer of organic dielectric material. Selected lines or pads of one conductive layer are often in electrical contact with selected ones of lines and/or pads of other conductive layers using plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is meant to include all three types of such substrate openings.

Known methods for fabricating such PCBs, chip carriers and the like typically comprise fabrication of separate inner-layer circuits (circuitized layers), which are formed by coating a photosensitive layer or film (often referred to simply as photo-resist) over a copper layer of a copper clad inner-layer base material. The organic photosensitive coating is imaged, developed and the exposed copper is etched to form conductor lines. After etching, the photosensitive film is stripped from the copper leaving the circuit pattern on the surface of the inner-layer base material. This processing is also referred to as photolithographic processing in the PCB art and further description is not deemed necessary. Following the formation of individual inner-layer circuits, a multilayer stack is formed by preparing a lay-up of inner-layers, ground planes, power planes, etc., typically separated from each other by a dielectric, organic pre-preg typically comprising a layer of glass (typically fiberglass) cloth impregnated with a partially cured material, typically a B-stage epoxy resin. Such an organic material is also referred to in the industry as "FR-4" dielectric material. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the inner-layer circuits. A photosensitive film is applied to the copper cladding. The coating is exposed to patterned activating radiation and developed. An etching solution such as cupric chloride is then used to remove copper bared by the development of the photosensitive film. Finally, the remaining photosensitive film is removed to provide the exterior circuit layers.

Conductive thru-holes (or interconnects), if used, serve to electrically connect individual circuit layers within the structure to each other and to the outer surfaces and typically pass through all or a portion of the stack. Thru-holes may be formed prior to the formation of circuits on the exterior surfaces by drilling holes through the stack at appropriate locations. Alternatively, such holes may be formed within the individual circuitized layers prior to incorporation within the multi-layered structure and final lamination thereof. In both methods, the bare walls of these holes are usually subjected to at least one pre-treatment step after which the walls are catalyzed by contact with a plating catalyst and metallized, typically by contact with an electro-less or electrolytic copper plating solution. If the thru-holes are PTHs, interconnections are thus formed between selected ones of the circuitized layers of the multilayered final product which have one or more conductive lines or elements in contact with the inner conductive layer of the PTHs. If the thru-holes are individually formed within selected layers and then coupled to one another during product stacking, connectivity is accomplished preferably using a conductive paste or the like. (It is also known to use such pastes in PTHs as described above, including in combination with the plated walled versions thereof.) Such conductive pastes are known to include a highly conductive metal such as silver in the form of flakes. Following formation of the conductive thru-holes in multi-layered structures such as PCBs in which the thru-holes are provided as PTHs, exterior circuits (outer-layers) are formed using the procedure described above. Such external formation may also occur when stacking layers already having thru-holes formed therein, albeit it is possible to form the two outer conductive layers prior to stacking and lamination.

After construction of the substrate having such connections therein, chips and/or other electrical components are mounted at appropriate locations on the exterior circuit layers of the multilayered stack. In some examples, such components are mounted and electrically coupled using solder ball technology, one form of which is referred to in the industry as ball grid array (BGA) technology. For PCBs, these components may include capacitors, resistors, and even chip carriers. For chip carriers having multilayered substrates, a chip is often solder bonded to the carrier laminate substrate's upper surface and the carrier is in turn solder bonded to an underlying substrate, typically a PCB. In either form (PCB or chip carrier), the components are in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the exterior surfaces and exposed and developed to yield an array of openings defining the pads. The openings are then coated with solder using processes known to the art such as wave soldering. Examples of organic products such as defined above are shown in the patents listed below, as are substrates of the non-organic (ceramic) type.

As defined herein, the present invention utilizes a new and unique type of conductive paste to provide interconnections within circuitized substrates. As will be defined, this paste is adapted for providing interconnections between conductive pads or the like conductors (including the end segments of thru-holes) on separate organic dielectric layers of the substrate, as well as within openings (included plated thru-holes or openings intended for plated thru-holes but wherein the plating has not been provided) provided with the dielectric layer(s) to couple selected conductors of the conductive layers within the substrate. More particularly, one embodiment of the conductive pastes as taught herein include what are referred to herein as "microparticles" of the metallic component of the paste composition. The term "microparticles" as used herein is meant to define particles one-hundred microns in size or less, including much smaller particles which are referred to in the art as nanoparticles or nanoparticulates. Typically, nanoparticles (also referred to in the art as nano-materials, nanocrystalline or nanostructured materials or simply nanostructures) refer to dense materials with grain sizes in the nanometer (one billionth of a meter) range. The designations "nanoparticles" or "nanoparticulates" is generally applied to any particulate matter with an average dimension below one micrometer. In the literature, the terms nanoparticulates, sub micrometer powders, nanopowders, nanoscale powders or nanocrystalline powders are often used interchangeably. The terms nanosuspension or nanodispersion usually refer to suspensions of discrete nanoparticulates, in either a liquid or in a solid matrix. Various types of "nanoscale" powders are known. Nanoscale metal oxides have been used in the paint industry, whereas nanoscaled silica powders are used as filler additives to tailor the rheological properties of a variety or organic suspensions. In the hard metals industry, ultrafine carbide and nitride powders are used to make cutting tools with increased strength and extended economic life over those produced from conventional powders. Still further, the use of oxide nanopowders in optics, electronic, and in cosmetics (e.g., for ultra-violet protection) has become known. As stated, the term "microparticles" is used herein to define the relative sizes of the particles used in this invention, and is meant to include particles of up to about one hundred microns in size, but in most cases, much smaller and even as small as those of the "nanoparticle" size.

In another embodiment of the invention, the conductive pastes capable of being used herein include what are referred to as "nano-wires" as the soldered conductive medium in addition to the binder. Generally speaking, the term "nano-wires" refers to two-dimensionally confined (ultra-small diameter in deep sub-100 nm regime) pieces of a solid in the form of tubes, rods, and similar elongated cylindrical structures. The surface-to-volume ratio of a nano-wire is significantly larger than the same ratio of geometrical features that can be defined by lithographic means. Nano-wires can be divided into two groups: (a) organic (carbon nano-tubes); and (b) inorganic (e.g. silicon, metal, e.g. platinum). When used in pastes as taught herein, these elements will include solder thereon and held in the paste composition using one or more of the binders taught herein.

With respect to particle usage, it is known that a decrease in particle size may result in enhanced sintering kinetics of some particulate materials. When particle size reaches the nanometer range, full densification is often possible at substantially lower temperatures than those needed for sintering coarse-grained particulates. This is because nanoparticles imply shorter diffusion lengths while promoting boundary diffusion mechanisms. In addition to savings in energy, lower sintering temperatures also result in reduced contamination, stresses and cracking during cooling. The enhanced sintering kinetics of nanoparticulate materials are already exploited in the microelectronic packaging industry, where metal alloy nanopowders are incorporated in cold-weldable welding pastes to achieve ductile and electrically conductive metal to metal bonds.

In U.S. Pat. No. 6,828,514, issued Dec. 7, 2004, there is defined a multilayered PCB including two multilayered portions, one of these able to electrically connect electronic components mounted on the PCB to assure high frequency connections there-between. The PCB further includes a conventional PCB portion to reduce costs while assuring a structure having a satisfactory overall thickness for use in the PCB field. Coupling is also possible to the internal portion from these components. This patent is assigned to the same Assignee as the instant invention.

In U.S. Pat. No. 6,815,837, issued Nov. 9, 2004, there is defined an electronic package (e.g., a chip carrier) and information handling system utilizing same wherein the package substrate includes an internally conductive layer coupled to an external pad and of a size sufficiently large enough to substantially prevent cracking, separation, etc. of the pad when the pad is subjected to a predetermined tensile pressure. This patent is also assigned to the same Assignee as the instant invention.

In U.S. Pat. No. 6,809,269, issued Oct. 26, 2004, there is defined a circuitized substrate assembly and method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith. One example of a product using this technology is a chip carrier. This patent is also assigned to the same Assignee as the instant invention.

In U.S. Pat. No. 6,762,496, issued Jul. 13, 2004, there is described a sintered aluminum nitride substrate which has a via hole and an internal electrically conductive layer with, allegedly, high thermal conductivity and high adhesion strength between the sintered aluminum nitride substrate and the internal electrically conductive layer or the via hole. The substrate consists of an internal electrically conductive layer, at least one electrically conductive via hole formed between the internal electrically conductive layer and at least one surface of the substrate, wherein the thermal conductivity of the aluminum nitride sintering product at 25 degrees Celsius (C.) is described as being 190 W/mK or more, with a corresponding adhesion strength between the aluminum nitride sintering product and the internal electrically conductive layer also mentioned.

In U.S. Pat. No. 6,743,319, issued Jun. 1, 2004, there is described an electronic circuit which is made by printing a "Parmod.RTM" composition (commercially available from a company called Parelec, LLC, from Rocky Hill, N.J. and, per the author, described in U.S. Pat. Nos. 5,882,722 and 6,036,889) on a temporary substrate and curing it to produce a pattern of metal conductors. The conductors are laminated to a substrate under heat and pressure to produce a laminate with the metal pre-patterned into the desired circuit configuration. The conductor can also be coated with a polymer and cured to form a pre-patterned substrate. Single and double-sided circuits or multi-layers can be made this way. Per the author, the compositions include printable inks and pastes, which consist of metal flakes and/or powders mixed with a Reactive Organic Medium (ROM). The compositions are printed on the substrate and heated, as mentioned above, which decomposes the ROM, which in turn chemically welds the particulate constituents together, causing the residual organic material to leave as vapor. The result, according to this author, is a metallic deposit which can function as an electrical conductor with low resistivity and which is solderable.

In U.S. Pat. No. 6,740,287, issued May 24, 2003, there is described a method of fabricating nanostructure bodies by integrating the steps of attriting precursor nanometer-sized particulate materials, desorbing the exposed surfaces of the attrited nanoparticulates, adsorbing a surfactant on at most fifty percent of the desorbed surfaces and dispersing the surfactant-coated nanoparticulates in an organic matrix to form a homogeneous thermoplastic compound from which green bodies are shaped, dewaxed and sintered.

In U.S. Pat. No. 6,641,898, issued Nov. 4, 2003, there is described a heated and pressed printed wiring board which is made by filling "via" holes formed in layers of insulating film of the wiring board with an interlayer conducting material. The insulating film is stacked with conductor patterns, and each conductor pattern closes a hole. The interlayer conducting material forms a solid conducting material in the holes after a heating a pressing procedure. The solid conducting material includes two types of conducting materials. The first type of conducting material includes a metal, and the second type of conductive material includes an alloy formed by the metal and conductor metal of the conductor patterns. The first type of conducting material includes indium particles, tin and silver wherein tin accounts for approximately 20-80 weight percentage of the solid conductive material, and the second type of conducting material includes an alloy comprised of the solid conductive material and the conductor metal. The conductor patterns are electrically connected reliably without relying on mere mechanical contact.

In U.S. Pat. No. 6,623,663, issued Sep. 23, 2003, there is described an electro-conductive paste for use in making ceramic substrates containing from about 5 to 18 percent by weight of an organic vehicle consisting of a solvent and a binder, from about 80 to 93 percent by weight of an electro-conductive metal powder in a spherical or granular shape and with a particle diameter in the range of about 0.1 to 50 microns, and from about 2 to 10 percent by weight of a resin powder with a particle diameter in the range of about 0.1 to 50 microns which is insoluble in the solvent and has a low level of water absorption. This paste may be used for forming via hole conductors to be converted to external electrode terminals for the resulting ceramic products.

In U.S. Pat. No. 6,120,708, issued Sep. 19, 2000, there is described a conductive paste for forming via-holes in a ceramic substrate, which paste contains about 80-94 weight percentage spherical or granular conductive metal powder having a particle size of about 0.1-50 microns, 1-10 weight percentage resin powder which swells in a solvent contained in the conductive paste and has a particle size of about 0.1-40 microns, and about 5-19 weight percentage of an organic vehicle. The paste is described to hardly generate cracks during firing to thereby attain excellent reliability in electric conduction and which can provide a via-hole or through hole having excellent solderability and platability in a ceramic substrate structure.

In U.S. Pat. No. 5,891,283, issued Apr. 6, 1999, there is described a conductive paste for use in forming ceramic substrates in which the composition consists of an organic vehicle, copper powder and an organo-metallic resinate which includes, as the metal, at least one metal selected from the group consisting of Pt, Ni and Bi. The amount of the metal component in the organo-metallic resinate is in the range of about 0.1 to 5 weight percentage with respect to the total amount of the copper power and the metal component. The copper powder has preferably an average diameter in the range of about 2 to 30 microns.

In U.S. Pat. No. 4,775,439, issued Oct. 4, 1988, there is described a method of "applying a slurry of a vaporizable solvent, metal particles and a small amount of binder in the shape of the circuit pattern desired to a removable layer, vaporizing the solvent, covering the powdered metal and binder with an adhesive to hold the powdered metal and carrier in place on the removable layer, laminating the hydrocarbon containing substrate with pressure and heat to cause compacting of said powder and bonding of said compacted powder to said substrate by adhesive layer(sic), said heat being insufficient to destroy said adhesive, substrate and removable layer, and separation of the removable layer." The authors state that the adhesive is essential not only to bond the finished circuit to the final substrate but also to bond the metal particles together. They further state "A metal slurry of metal particles, e.g. noble metals such as silver, palladium, gold and platinum, is preferably mixed with the combination of other metal particles such as nickel or tin. A vaporizable solvent is mixed therewith as well as a small amount of a curable plastic binder." A particular mixture is given as an example this patent and described in column 4, lines 8-18. It is believed that such mixtures are similar to mixtures known as "Ormet" and are described in U.S. Pat. Nos. 5,538,789 and 5,565,267, among others. The mixtures are described by Ormet Corp. (formerly Toronaga Technologies) as "Transient Liquid Phase" materials because these function by heating the combination of high melting point and low melting point metal powders in a fluxing environment to the eutectic temperature at which the powders alloy and freeze again to form a continuous conductor. The mixture also includes an epoxy resin, which cures at the eutectic temperature and acts as a binder to fill the porosity between the metal particles and to adhere these to the substrate.

Complexity of the above organic products (those including organic dielectric layers, including the aforementioned PCBs and laminate chip carriers) has increased significantly over the past few years, especially as such products increase in demand over those of the ceramic variety. For example, PCBs for mainframe computers may have as many as thirty-six layers of circuitry or more, with the complete stack having a thickness of as much as about 0.250 inch (250 mils). Laminate chip carriers, in turn, may have as many as fifteen or more circuit layers as part thereof. Such organic products are known with three or five mil (a mil being one thousandth of an inch) wide signal lines and twelve mil diameter thru-holes, but for increased circuit densification in many of today's products, the industry is attempting to reduce signal lines to a width of two mils or less and thru-hole diameters to two mils or less. Such high densification understandably mandates the most efficient means of interconnecting the respective layers in the smallest space available and using the best materials possible. As defined herein, the present invention is able to accomplish this.

It is believed that a circuitized substrate having organic dielectric material as part thereof which is able to provide enhanced interconnection between various conductive portions (e.g., layers) thereof would constitute a significant advancement in the art. It is further believed that a method of making same, as well as an electronic assembly and an information handling system using same would constitute significant art advancements.

OBJECTS AND SUMMARY OF THE INVENTION

It is, therefore, a primary object of the invention to enhance the circuitized substrate art.

It is another object of the invention to provide a circuitized substrate having a new and unique conductive medium in the form of a conductive paste to thus assure an enhanced electrical connection between electrical elements which come in physical contact with the paste.

It is another object of the invention to provide a multilayered circuitized substrate assembly including two or more substrates bonded together to form a larger structure which can be used, e.g., as a PCB or chip carrier.

It is yet another object of the invention to provide an electrical assembly adapted for utilizing the circuitized substrate defined herein as part thereof.

It is a still further object of the invention to provide an information handling system adapted for utilizing the circuitized substrate defined herein as part thereof.

According to one aspect of the invention, there is provided a circuitized substrate comprising at least one organic dielectric layer having first and second opposing surfaces, at least one opening within the one organic dielectric layer extending from the first opposing surface to the second opposing surface, and a quantity of conductive paste positioned within the opening, this quantity of conductive paste including a binder component and at least one metallic component including a plurality of microparticles, selected ones of the microparticles including a quantity of solder thereon.

According to another aspect of the invention, there is provided a circuitized substrate comprising first and second organic dielectric layers each having a first surface thereon, the first surface of the first organic dielectric layer facing the first surface of the second organic dielectric layer, at least one electrical conductor positioned on each of the first surfaces, and a quantity of conductive paste interconnecting the electrical conductor on the first surface of the first organic dielectric layer to the electrical conductor on the first surface of the second organic dielectric layer, this quantity of conductive paste including a binder component and at least one metallic component including a plurality of microparticles, selected ones of these microparticles including a quantity of solder thereon.

According to still another aspect of the invention, there is provided a method of making a circuitized substrate comprising providing at least one organic dielectric layer having first and second opposing surfaces, forming at least one opening within the organic dielectric layer extending from the first opposing surface to the second opposing surface, and positioning a quantity of conductive paste within the opening, the quantity of conductive paste including a binder component and at least one metallic component including a plurality of microparticles, selected ones of these microparticles including a quantity of solder thereon.

According to yet another aspect of the invention, there is provided a method of making a circuitized substrate which comprises providing first and second organic dielectric layers each having a first surface thereon, forming at least one electrical conductor on each of the first surfaces, orienting the first and second dielectric layers such that the first surface of the first organic dielectric layer having at least one of the electrical conductors thereon faces the first surface of the second organic dielectric layer also having at least one of the electrical conductors thereon, and positioning a quantity of conductive paste between the first and second organic dielectric layers to interconnect the at least one electrical conductor on the first surface of organic dielectric layer to the electrical conductor on the first surface of the second organic dielectric layer, this quantity of conductive paste including a binder component and at least one metallic component including a plurality of microparticles, selected ones of these microparticles including a quantity of solder thereon.

According to a further aspect of the invention, there is provided a circuitized substrate comprising at least one organic dielectric layer having first and second opposing surfaces, at least one opening within the one organic dielectric layer extending from the first opposing surface to the second opposing surface, and a quantity of conductive paste positioned within the opening, this quantity of conductive paste including a binder component and a plurality of nano-wires, selected ones of the nano-wires including a quantity of solder thereon.

According to a still further aspect of the invention, there is provided a circuitized substrate comprising first and second organic dielectric layers each having a first surface thereon, the first surface of the first organic dielectric layer facing the first surface of the second organic dielectric layer, at least one electrical conductor positioned on each of the first surfaces, and a quantity of conductive paste interconnecting the electrical conductor on the first surface of the first organic dielectric layer to the electrical conductor on the first surface of the second organic dielectric layer, this quantity of conductive paste including a binder component and a plurality of nano-wires, selected ones of the nano-wires including a quantity of solder thereon.

BEST MODE FOR CARRYING OUT THE INVENTION

Figure 1:
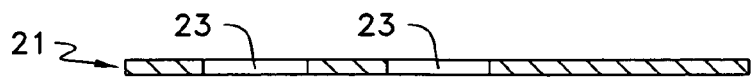
FIGS. 1-5 are side elevational views, in section, showing the steps of making a circuitized substrate according to one embodiment of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "circuitized substrate" as used herein in one embodiment is meant to include a substrate having at least one (and preferably more) dielectric layer(s) and at least two (and preferably more) conductive layers, said conductive layers each including one or more conductors (e.g., signal lines and/or pads). In another embodiment, the term is meant to include at least one or more dielectric layers and at least one (and preferably several) opening(s) therein extending through the dielectric layer thickness. In this latter embodiment, the substrate may also include one or more conductive layers. In said latter embodiment, the opening can be a thru-hole (as defined above) such as a PTH. Known examples of substrates such as those described in one or more of the foregoing patents typically include PCBs or chip carriers with several dielectric layers made of one or more of the following dielectric materials: fiberglass-reinforced epoxy resin ("FR-4"), polytetrafluoroethylene (Teflon), polyimide, polyamide, cyanate resin, photo-imageable material, and other like materials. These known structures include several conductive layers each being a metal layer (e.g., power, signal and/or ground) comprised of suitable metallurgical materials such as copper or copper alloy, but may include or comprise additional metals (e.g., nickel, aluminum, etc.) or alloys thereof. Further examples will be described in greater detail hereinbelow. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. As defined herein, the substrates of the present invention may also include as part thereof one or more dielectric layers of the "high temperature" kind. By the term "high temperature" when defining a dielectric layer as used herein is meant such a layer which can withstand temperatures greater than about 350 degrees C. for a time period long enough to enable successful lamination of the layer with other layers/substrates, usually a period of about two hours, without the dielectric material breaking down into low molecular weight fragments. One example of such material known today is sold under the product name "RO2800" dielectric material by Rogers Corporation, Rogers, Conn. "RO2800" is a trademark of Rogers Corporation.

By the term "conductive paste" as used herein is meant an electrically conductive paste composition adapted for use in holes or openings of substrates as well as between conductors which form parts of conductive planes of such a substrate. Such a paste will include at least one organic binder component and, in one embodiment, at least one metallic component including a plurality of "microparticles." In another embodiment, the paste will include such an organic binder in addition to the afore-mentioned nano-wires, the wires including solder thereon (as do the microparticles in the first embodiment). Such pastes may be of the "low temperature" type. By the term "low temperature" as used herein when defining conductive pastes is meant a paste wherein the organic binder breaks down into low molecular weight fragments at a temperature greater than about 330 degrees C. This temperature is understood to be below the above temperature of a "high temperature" dielectric material, if such a material is utilized. Examples of such conductive pastes are defined below.

By the term "electrical assembly" is meant at least one circuitized substrate as defined herein in combination with at least one electrical component (defined below) electrically coupled thereto and forming part of the assembly. Examples of known such assemblies include chip carriers which include one or more semiconductor chips as the electrical components, the chips usually positioned on the substrate and coupled to wiring (e.g., pads) on the substrate's outer surface or to internal conductors using one or more thru-holes. Another example is a printed circuit board, albeit if using the teachings of this invention, such a structure will include typically one such circuitized substrate in combination with at least one additional substrate having, e.g., two or more conductive layers and/or thru-holes therein, the resulting structure in turn including one or more electrical components coupled thereto. Further definition is provided below.

By the term "electrical component" as used herein is meant components such as semiconductor chips and the like which are adapted for being positioned on the external conductive surfaces of circuitized substrates and electrically coupled to the substrate for passing signals from the component into the substrate whereupon such signals may be passed on to other components, including those mounted also on the substrate, as well as other components such as those of a larger electrical system which the substrate forms part of.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

FIGS. 1-5 illustrate the steps of making a circuitized substrate according to one aspect of the invention. In FIG. 1, a conductive layer 21, preferably a copper sheet, is etched (e.g., using an etching solution including cupric chloride) to define a plurality of openings 23 therein. Although only two openings are depicted in FIG. 1, this is meant to be representative only. In one example, a total of 2500 openings may be provided within a rectangular layer having dimensions of about 52.5 millimeters (mm) wide by about 52.5 mm long, and a thickness of about 0.0356 mm. Openings 23, in the embodiment shown here, are meant to form "clearance" openings in the finished substrate, such that conductive openings (defined below) may be formed within the substrate and extend through the substrate without electrically contacting the conductive layer 21. "Clearance" openings are known in the PCB art and further definition is not deemed necessary.

Figure 2:
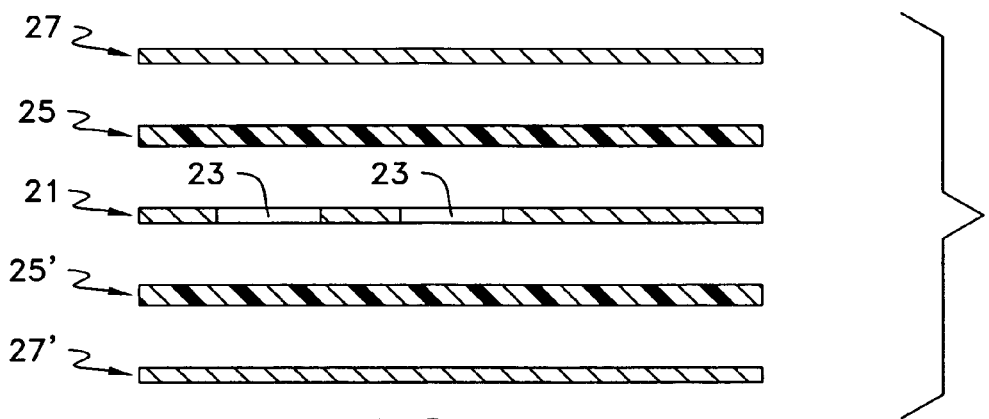

As shown in FIG. 2, layer 21 is then aligned with opposing dielectric layers 25 and 25', in addition to opposing conductive layers 27 and 27'. Layers 27 and 27' are also preferably copper and may possess the same dimensions as layer 21, although the thickness of said layers may be different than that of layer 21, with one example of such thickness being about 0.012 mm. In this embodiment (and possibly also in other embodiments defined herein), each of the dielectric layers 25 and 25' is a high temperature dielectric layer, meaning that each can withstand temperatures greater than about 350 degrees C. for a time period long enough to enable successful lamination of the layers with other elements which are to form the substrate, or, in one embodiment, a multilayered substrate assembly comprised of two or more substrates laminated together. A preferred example of such material known today is the aforementioned "RO2800" dielectric material sold by Rogers Corporation. "RO2800" is a polytetrafluoroethylene (PTFE) composite material having a low dielectric constant and includes fused silica as one of the composition elements. It is rated with 0% water solubility and has a specific gravity of 2.1. Each layer 25 and 25' includes an initial thickness of about 0.05 mm. The aligned subassembly of FIG. 2 is now laminated together to form a "sandwich", as now seen in FIG. 3. Conventional lamination processing and equipment may be used. In one example, the five layers shown in FIG. 2 may be laminated at a temperature of about 365 degrees C. using a pressure of about 2000 pounds per square inch (PSI) for a time period of about 125 minutes.

Figure 3:
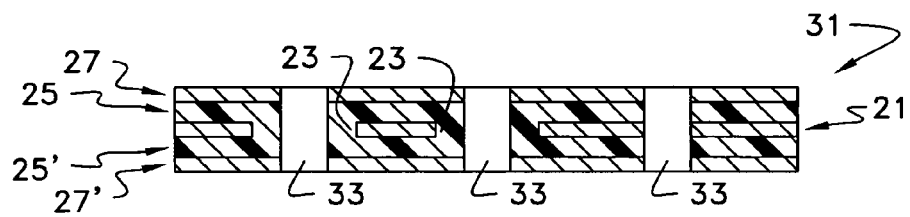

The resulting laminated structure 31 is shown in FIG. 3. When compressed from layers having the above initial thickness dimensions, the laminated structure 31 of FIG. 3 will possess a total thickness of about 0.160 mm. After lamination, a plurality of openings 33 are formed within structure 31, preferably using laser or mechanical drilling. In one example, a total of 5600 openings may be provided, each preferably having a diameter of about 0.050 mm. It is noted that the dielectric material of layers 25 and 25' has extended within the clearance openings 23 as a result of the lamination step, such that this material now forms the side walls of the portion of the openings 33 located within layer 21. Further, it is noted that openings 23 have the conductive material of layers 27 and 27' for the walls in the outer portions of the laminated structure. FIG. 3 also shows that an opening 33 is formed within the structure at a location distant from the openings 23 such that the opening (to the right in FIG. 3) will physically contact middle conductive layer 21. Thus, this particular opening 33 will include side walls of conductive material at layer 21, unlike the other two openings to the left in FIG. 3. As explained below, this represents an alternative means of providing electrical coupling of selected elements of the invention.

Figure 4:
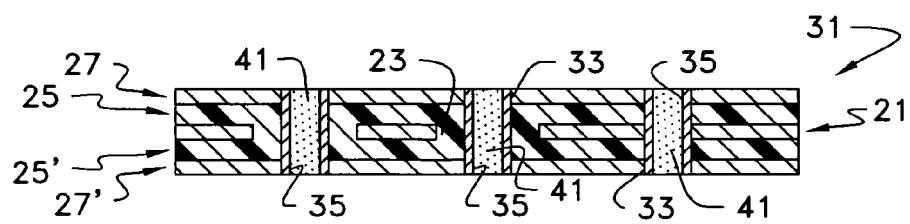

In FIG. 4, each of the openings 33 is plated, preferably with copper, to form inner conductive layers 35. A preferred method of accomplishing this is to use a "flash" plating of electro-less copper. This plating process is typically comprised of four operations: cleaning; activation; acceleration; and deposition. During the cleaning phase, organic contaminants are removed from exposed metal surfaces. Activation includes a dip in a catalyst bath typically including hydrochloric acid and possibly tin or sodium chloride, and activation in a bath of hydrochloric acid, tin chloride and palladium chloride. The tin (Sn+2) ion reduces the palladium (Pd+2) to palladium, which is deposited on the substrate. Remaining Sn+2 and Sn+4 are selectively removed by an accelerator such as fluoboric or sulfuric acid with hydrazine. Key elements of the electro-less copper chemistry include sodium hydroxide, formaldehyde, EDTA (or other chelater) and a copper salt. During the complex reaction with the palladium as a catalyst, the formaldehyde reduces the copper ions to metallic copper. Each layer 35 has a thickness of only about 0.001 mm. It is seen in FIG. 4 that the plated opening to the right is electrically coupled to inner layer 21 because the plating is deposited on the exposed areas of layer 21. The plating of the other two openings to the left in FIG. 4 are in contact with the defined dielectric material of layers 25 and 25' in addition to the outer conductive layers 27 and 27'. The right opening 33 is also in contact with the outer conductive layers 27 and 27'. It is to be understood that forming plated layers 35 is an optional step in forming a substrate as defined herein, but is preferred to further assure sound conductive paths in these portions of the structure.

The next step, as also shown in FIG. 4, involves the deposition of conductive paste 41 within each of the plated openings. Such deposition may be accomplished using conventional paste printing processes or dispensing through convention needles. Significantly, the conductive paste as used in this embodiment includes a binder (preferably an organic binder) component and at least one metallic component. As defined herein, this metallic component is in the form of microparticles, either as flakes or semi-colloidal powders. Metals which may for the microparticles include copper, silver, gold, zinc, cadmium, palladium, iridium, ruthenium, osmium, rhodium, platinum, iron, cobalt, nickel, indium, tin, antimony, lead, bismuth and alloys thereof. In one embodiment of the invention, a conductive paste having silver microparticles may be used, the paste including an anhydride epoxide as the organic binder. This paste preferably includes about eighty-eight percent by weight of the silver microparticles and about twelve percent by weight of the anhydride epoxide. With the solder added to the microparticles (see below), the resulting paste will have a decomposition temperature of approximately 340 degrees C., which, when considering the above high temperature dielectric material, is about ten degrees C. less than the 350 degrees C. temperature the dielectric can withstand during lamination. The silver microparticles are each from about 0.01 microns to about 50 microns in diameter. In the case of both flat particles (flakes) and rod-like particles, thicknesses are each from about 0.01 micron to 10 micron.

The above weight percentages are not meant to limit the invention. It is possible to use conductive paste compositions in which the flake or powder (or a combination of both) comprises from about sixty to about ninety-eight percent of the total composition, with the organic binder comprising the remainder. The exact percentage depends on the metal(s) used and form (powder or flake) thereof, in addition to the desired composition viscosity.

According to the teachings of this invention, selected ones of the microparticles include a quantity of solder thereon. Acceptable solders for this purpose include tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. In one embodiment, the solder is coated onto the metallic microparticles using a conventional immersion process. Alternatively, electroplating (electro-less plating) may be used. In addition to the solder layer, a thin layer of precious metal (e.g., gold) may also be added over the solder layer to minimize or prevent oxidation.

In another embodiment of the invention, the conductive paste may be a composition of the above binder and also defined above nano-wires, the nano-wires including solder thereon to provide the enhanced connectivity through the paste. The solder is heated similarly as the solder is on the nanoparticles to form the enhanced connections within the paste. It is also within the scope of this invention to combine both nanoparticles and nano-wires with the binder in the composition.

The following six examples represent various combinations of solder-coated particles and processes used to prepare solder coatings according to various aspects of the invention. These are understood to be examples only and not limiting of the scope of this invention.

EXAMPLE ONE

Ten grams (gm) of silver powder available from Degussa Corporation, South Plainfield, N.J. (hereinafter simply Degussa) was mixed together with 150 ml Rohm and Haas (having a business location at Freeport, N.Y., hereinafter simply Rohm and Haas) tin-lead electrolytic solution. This mixed solution was kept in the electroplating bath and stirring vigorously at about 26 degrees C. A tin-lead rod was used as the anode and thin copper foil was used as the cathode for this electroplating process. About thirty amps per square foot current density were applied. The solder coated silver particles were removed from the electrolytic solution and washed with water and air dried at room temperature. These particles were coated by the tin-lead solder only when the particles were in contact with the cu surface of the cathode. The extent of contact between the particles and cathode determined the extent of solder coating. This coating process was controlled by vigorous stirring of the electrolytic solution and by thinning of the copper electrodes.

EXAMPLE TWO

As in Example One, ten gm of silver powder available from Degussa was mixed together with 150 ml Rohm and Haas tin-lead electrolytic solution. This mixed solution was kept in the electroplating bath and stirring vigorously at about 26 degrees C. A tin-lead rod was used as the anode and thin copper foil was used as the cathode for this electroplating process. About thirty amps per square foot current density were applied. The solder coated silver particles were removed from the electrolytic solution and washed with water and air dried at room temperature. One gram of an air-dried sample was slowly added to forty ml of autocatalytic gold solution available from Atotech USA, Inc., Rock Hill, S.C. (hereinafter simply Atotech). The mixed solution was stirred f for one hour at eighty degrees C. to deposit gold and produce gold-tin-lead solder coated silver particles. These coated particles were then separated from solution, washed with de-ionized water and air dried at room temperature.

EXAMPLE THREE

Five gm of copper metal powder available from Fisher Chemical (having a business location at Fair Lawn, N.J., and hereinafter simply referred to as Fisher Chemical) was mixed together with 150 ml Rohm and Haas tin-lead electrolytic solution. The mixed solution was kept in the electroplating bath and stirred vigorously at 26 degrees C. A tin-lead rod was also used as the anode and thin copper foil used as the cathode for the electroplating process. About thirty amps per square foot current density were used for tin-lead solder electroplating/coating on the copper particle surfaces. The solder-coated copper particles were removed from the electrolytic solution and washed with de-ionized water and air dried at room temperature.

EXAMPLE FOUR

Ten gm of thiourea was dissolved in seventy-five ml of water at 65 degrees C. Five gm of copper metal powder available from Fisher Chemical was mixed together with seventy-five ml of thiourea solution at sixty-five degrees C. and stirred to get a uniform slurry. About eighty ml immersion tin solution available from Rohm and Haas was then dropwise added to the slurry. A precipitate of tin-solder coated copper was observed. The precipitate was filtered and washed with de-ionized water and air dried at room temperature. The solder coating thickness was measured to be about 100 nm (0.1 micron).

EXAMPLE FIVE

Fifteen gm of copper powder with an average particle size of four microns was slowly mixed with sixty ml of immersion tin solution at 55 degrees C. and stirred for ten minutes. Tin-copper solder coated copper was precipitated, the precipitate filtered and washed with water. About forty ml of immersion gold solution available from Atotech was added to the precipitate. The mixed solution was stirred at 85 degrees C. for one hour to deposit gold and produce gold-tin, solder-coated copper particles. The coated particles were separated from the solution and washed with de-ionized water and air dried at room temperature.

EXAMPLE SIX

Fifty gm of cycloaliphatic epoxy resin (e.g., one sold under product designation "ERL-4211" by the Union Carbide Corporation, Danbury, Conn.) was mixed with about fifty gm of hexahydro-4-methylphthalic anhydride and 0.05 gm N, N dimethyl benzylamine. The mixed solution was stirred for ten minutes to assure uniform mixing. Eighty-five gm of tin-lead solder coated silver powder was added to fifteen gm of the mixed solution to form a paste. A thin layer of this paste was then deposited on a copper substrate and cured under lamination at approximately 188 degrees C. using a pressure of about 2000 pounds per square inch for a time period of about 120 minutes. The resulting paste was conducting, with the conductivity measured about $10^{-5}$ ohm-cm.

Figure 5:
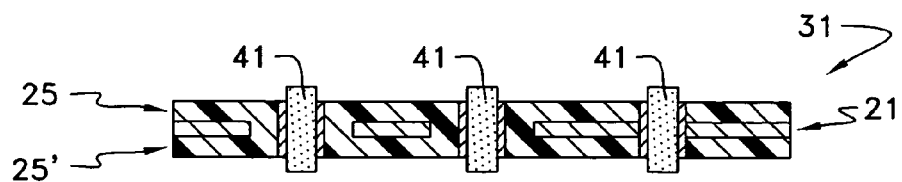

As understood from the foregoing, the function of the solder is to provide an enhanced electrical connection through the paste in the final substrate structure. Significantly, the solder will melt during subsequent lamination procedures such as when the structure of FIG. 5 is bonded to other dielectric and conductive layers to form a larger, multilayered substrate. The heat generated during such lamination is well known, and is necessary to adequately bond (laminate) the various layers (including the layered structure of FIG. 5) together into such a thicker circuitized substrate. If the dielectric layers are of the high temperature type as mentioned above and said paste is of the low temperature as also defined, the resulting solder flow will occur and form a series of interconnecting paths through the paste, thereby enhancing the connection formed. The dielectric layers of the structure are also not harmed because these are able to withstand the lamination temperatures.

It is understood that this invention is not limited to use of high temperature dielectric materials and/or low temperature conductive pastes. It is only necessary that the metal microparticles or the nano-wires having the solder thereon are capable of being heated sufficiently to melt the solder to cause at least partial re-flow thereof to create bonds between selected pairs of adjacent soldered microparticles or nano-wires, thereby forming connecting "bridges" of solder between such microparticles and nano-wires and thus the enhanced circuit paths. It is also necessary that such solder melting occur at a temperature not detrimental to the dielectric materials used for the substrate's dielectric layers. As defined, the invention is able to accomplish this.

In FIG. 5, the structure of FIG. 4 is now subjected to an etching step in which all of the external metal of layers 27 and 27' is removed, in addition to the upper and lower portions of the plated layers of the openings which were in contact with layers 27 and 27'. Projecting portions of conductive paste 41 remain, as shown. The structure shown in FIG. 5 is thus a circuitized substrate in the broadest sense of the invention, meaning that it includes at least one layer of high temperature dielectric with at least one opening having a low temperature conductive paste therein. This substrate is thus able to provide a plurality of electrical connections through the paste using the electrical paths of solder and, if present, the other paths formed between simply the metal nanoparticles (or nano-wires, if used) which do not include solder coating thereon. Preferably, all nanoparticles (or nano-wires) include such solder thereon, but it is within the scope of the invention to mix both solder-coated and microparticles (or nano-wires) not including solder. It is also possible to combine microparticles and nano-wires in the composition with the binder holding all together. The formed enhanced paths understandably run, at a minimum, from the upper surface to the lower surface of the structure, and thus the length of each opening since the paste fully occupies each opening. Such a connection may occur in less than the full length should the openings each have the defined plated layers therein and less than a full length of paste is used. Preferably, however, the paste of the invention fully occupies each opening, and, when the structure is as shown as in FIG. 5, projects a small distance from the external surfaces in the manner indicated.

The FIG. 5 structure also shows the use of metal layers (35 in FIG. 4) on the interior walls of the substrate's openings. This is not necessary in the broader aspects of the invention, as the conductive paste 41 may serve as the lone conductive medium within the openings.

Figure 6:
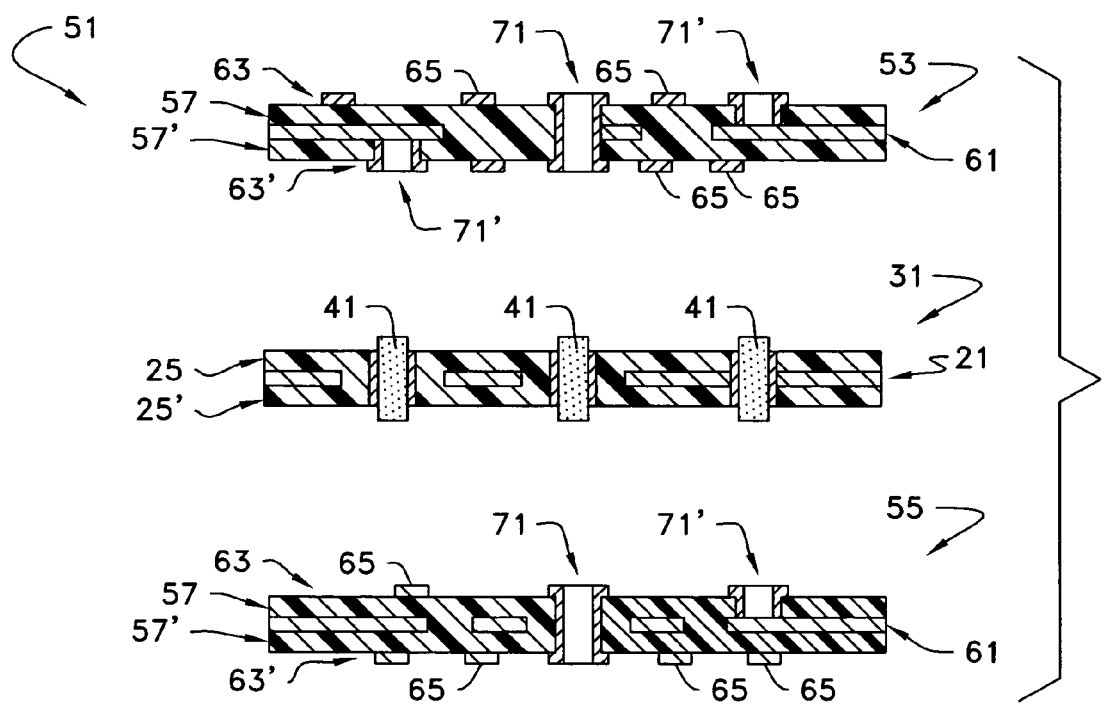
FIG. 6 is an exploded, side elevational view, in section, showing the various parts of a multilayered circuitized substrate assembly according to one embodiment of the invention.

FIG. 6 represents one example of a multilayered circuitized substrate assembly 51 according to one embodiment of the invention. Assembly 51 utilizes the circuitized substrate of FIG. 5 as an interconnector to electrically couple two opposing substrates 53 and 55. Each substrate 53 and 55 may include at least one dielectric layer 57 (preferably two, including a second layer 57') with at least one conductive layer 61 (preferably two additional outer conductive layers 63 and 63' for each, one or both of these added layers being in the form of a signal layer having a plurality of electrical conductors 65 (in FIG. 6, these are preferably signal lines or pads) as part thereof. The dielectric material for each of the dielectric layers of the substrates 53 and 55 is preferably a high temperature dielectric and preferably the same material as that used for layers 25 and 25' of the interconnecting substrate defined above. Substrates 53 and 55 may also include a plurality of thru-holes, including in the form of a PTH 71 or a "blind" via 71', for being electrically coupled to designated conductive elements of the substrates. The three substrates shown in FIG. 6 are aligned to assure subsequent electrical connection between corresponding conductive elements (especially between the projecting paste 41 segments and corresponding, facing conductive elements of the opposing substrates). For example, the paste 41 to the right of substrate 31 is shown to align with the corresponding lower conductor 65 on the undersurface of upper substrate 53, while the lower projecting segment of this same paste is aligned to connect to the upper conductive portion of a "blind" via (thru-hole) 71' located on the upper surface of the lower substrate 55. Such an upper conductive portion also understandably represents an electrical "conductor" such as the conductors 65 because it is capable of being engaged by paste and thus electrically coupled thereto. A sound electrical path is thus formed between the lower right pad 65 on upper substrate 53 and the inner conductive layer 61 of lower substrate 55 when the three substrates of FIG. 6 are laminated together. Several other electrical paths are readily discernible from the structure formed using these three substrates and further description is not considered necessary.

Lamination of the three substrates of FIG. 6 is accomplished using conventional lamination equipment. In one embodiment, lamination is accomplished at a pressure within the range of from about 1700 PSI to about 2300 PSI for a total time period of about 300 minutes (3 hours). During this time period, the lamination temperature is raised from an initial ambient temperature of about 70 degrees Fahrenheit (F) to about 688 degrees F. in about 45 minutes and held at said elevated temperature for a period of about 125 minutes. The temperature is then decreased to about 500 degrees F. over a time period of about 100 minutes and then to a temperature of about 350 degrees F. over a period of the remaining minutes in the total time period defined above, after which it is dropped to the initial ambient temperature. This lamination procedure is deemed successful when laminating the substrates having the dielectric material and conductive paste defined above. Other temperatures, times and pressures will likely be required for alternative materials. Significantly, the heat from this lamination serves to melt the solder located on the conductive paste metallic microparticles or nano-wires, as defined above, assuring the enhanced connective (circuit) paths in which this paste forms a part.

The three substrate embodiment shown in FIG. 6 is representative only and not meant to limit the invention. It is within the scope of this invention to combine several additional substrates, including utilizing two or more interconnecting substrates as shown in FIG. 5 in combination with four or more substrates of the type represented by substrates 53 and 55, to form other multilayered assemblies having many additional conductive layers and thus operational capabilities. These additional substrates may be, understandably, also formed using the unique methodology taught herein. For example, substrate 53 may be formed by laminating two high temperature dielectric layers onto the interim conductive layer 61 (following clearance opening formation, if desired) and the thru-holes 71 and 71' then formed to the desired depths as shown. The outer circuit layers can be formed using conventional photolithographic processing known in the PCB art in which an outer copper layer is covered with a suitable photo-resist, the resist is developed to expose a pattern, and the structure is then etched to remove undersired (exposed) copper to produce the desired pattern. As stated, such processing is known and further explanation is not considered necessary. As explained above, the conductive paste may function as a conductive medium within a plated or non-plated opening with a designated dielectric layer (or layers). In addition, the paste may be used to simply couple electrical conductors on matching pairs of substrates. More specifically, a circuitized substrate of one embodiment of the invention may comprise two separate dielectric layers each with an electrical conductor thereon. Such conductors may be formed using conventional photolithography processing, as mentioned, and serve as signal lines or pads for the layer-conductor "sub-composite." These "sub-composites" are aligned with the respective conductors on a corresponding facing (e.g., first) surface thereof also facing one another. Conductive paste of the type defined herein is positioned between the facing conductors (e.g., using a needle dispenser or printing operation) by preferably applying it to one "sub-composite" (on the conductor(s) thereof). The sub-composites are then laminated using conventional equipment and a circuitized substrate is formed, this substrate thus including, at a minimum, the two conductors (preferably two conductive planes each including a plurality of such conductors) electrically coupled using the invention's conductive paste. This structure will also include, as a minimum, the two dielectric layers which support the conductive planes, respectively. Other conductive and dielectric layers may also be added to form a thicker, multilayered structure.

To produce an electrical assembly of the type defined above, a circuitized substrate as formed using the teachings herein is then coupled to one or more electrical components (e.g., a semiconductor chip). In one embodiment, such coupling may be accomplished using solder ball connectors and convention "C-4" solder attach technology. "C-4" stands for controlled collapse chip connection in which solder balls connect contact sites on the chip underside to conductors on the upper surface of the circuitized substrate. This form of connection is well known in the art and further explained below.

Figure 7:
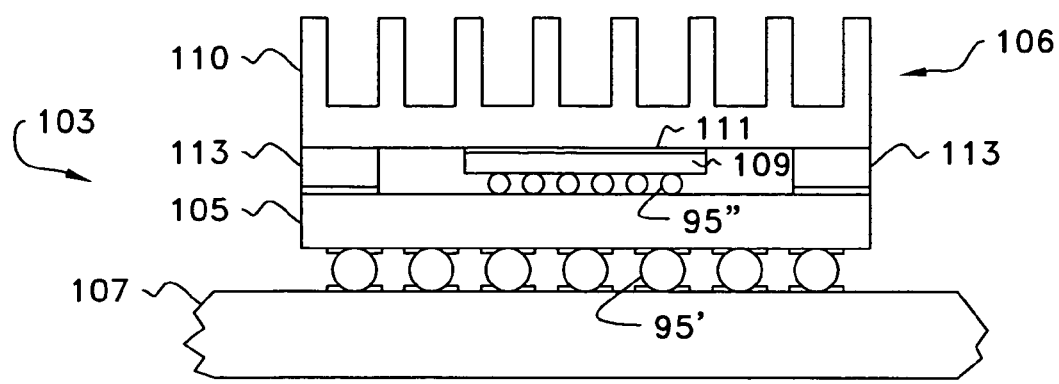
FIG. 7 is a side view of two examples of electrical assemblies which can utilize the circuitized substrates of the invention.

FIG. 7 represents examples of such circuitized substrate electrical assemblies as taught herein in use within a larger electronic assembly 103. One assembly, referenced by the numeral 105, may form part of a larger chip carrier assembly 106, while the assembly represented by the numeral 107 may be a PCB, designed to have carrier assembly 106 positioned thereon and electrically coupled thereto. Therefore, each of the assemblies as taught herein may function in combination with other such assemblies and thus provide the enhanced conductive paste connections taught herein for a much larger structure. As mentioned above, each assembly includes one or more of the circuitized substrates taught herein. For example, the substrate assembly 105 for carrier 106 may be of the construction of the assembly formed in FIG. 6. In this case, assembly 105 of chip carrier 106 is preferably mounted on and electrically coupled to PCB 107 using a plurality of the aforementioned solder balls 95' (preferably of conventional tin-lead composition), the chip carrier 106 in turn having a semiconductor chip 109 positioned thereon and electrically coupled to the upper portion of assembly 105 using a second plurality of solder balls 95" (also preferably of conventional tin-lead composition). In both cases, the outer pads (i.e., pads 65 on the upper surface of substrate 53) may function as solder pads designed for having a solder ball positioned thereon and reflowed once in position. The upper pads of underlying PCB 107 may provide a similar function to accommodate solder balls 95'. If PCB 107 is of the same or similar construction as the structure of FIG. 6, the upper conductors 65 of substrate 53 may provide this function. The chip carrier assembly 106 may also include a heat sink 110 thermally coupled to the chip 109, e.g., using a thermally conductive paste 111, and positioned on the upper surface of the carrier by appropriate standoffs 113, as is known in the art. It is also within the scope of those skilled in the art to utilize an encapsulant material (not shown) to substantially encase the chip and also to possibly eliminate the need for the heat sink if such an encapsulant material is used. Encapsulant material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 8:
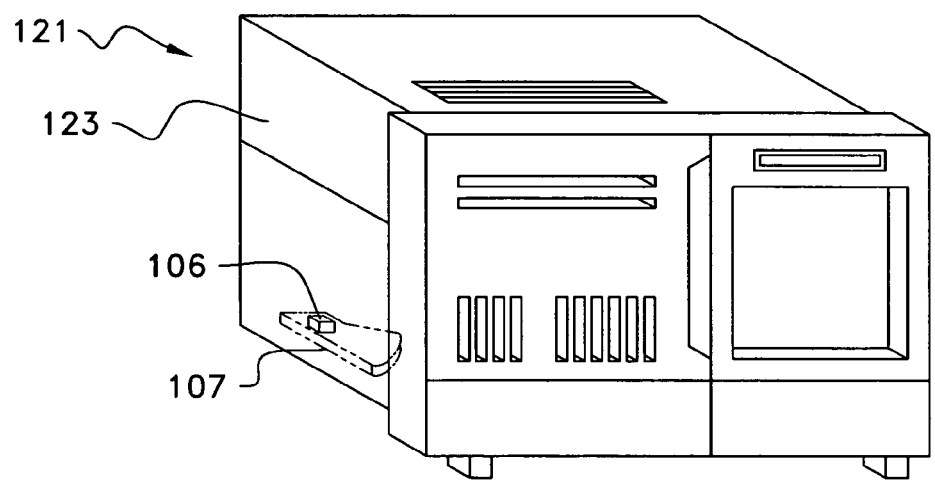
FIG. 8 is a perspective view of an information handling system adapted for using at least one circuitized substrate of the invention.

In FIG. 8, there is shown an information handling system 121 which is preferably a personal computer, a mainframe computer or a computer server. Other types of information handling systems, including well-known products such as cell-phones, televisions, etc. known in the art may also utilize the teachings of this invention. The circuitized substrate assemblies formed in accordance with the teachings herein may be utilized in the system 121 as a PCB 107 (shown hidden) and/or a chip carrier 106 (also shown hidden). The circuitized substrate assemblies may be utilized as a motherboard in system 121 or as one or more individual PCBs typically utilized in such systems. As is known, computer and the like systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

Thus there has been shown and described a circuitized substrate in which highly effective electrical connections are made possible through the use of a new and unique conductive paste formulation which utilizes a metallic component including microparticles and/or a plurality of nano-wires with connection-enhancing solder thereon. The substrates as taught herein may include high temperature dielectric materials and the corresponding pastes may be of the low temperature type, meaning that the paste solder will melt during conventional lamination processing but the dielectric will remain unharmed. Various embodiments of such substrates may be combined together to form a larger, multilayered substrate assembly which can be utilized in such electronic structures as information handling systems. Such systems are thus able to benefit by the unique, advantageous features of this invention.

While there have been shown and described what are at present considered the preferred embodiments of the invention, it will be obvious to those skilled in the art that various changes and modifications may be made therein without departing from the scope of the invention as defined by the appended claims. The invention as defined herein is also capable of transmitting both regular and high speed (frequency) signals, the latter at a rate of from about one Gigabits/sec to about ten Gigabits/second, while substantially preventing impedance disruption. It is also capable of being produced using many conventional PCB processes so as to assure reduced cost and facilitate ease of manufacture. That is, the preferred method for assembling the circuitized substrate of the invention preferably involves the use of conventional lamination processes as part of the method in which the dielectric layers, having the designated circuitry and/or conductive elements (planes) thereon or within, are "stacked up" in aligned manner with one another and subjected to relatively high pressures and temperatures for the defined time periods.

What is claimed is:
1. A circuitized substrate comprising:
   at least one organic dielectric layer having first and second opposing surfaces;

at least one opening within said at least one organic dielectric layer extending from said first opposing surface to said second opposing surface;
a quantity of conductive paste positioned within said at least one opening, said quantity of conductive paste including a fluxless binder component and at least one metallic component including a plurality of particles in the nanoparticle and microparticle range, selected ones of said particles of said metallic component also including a quantity of solder thereon, said solder comprising metallic elements different from the elements of said particles; and
a protective coating disposed over said solder for preventing oxidation thereof.

2. The circuitized substrate of claim 1 in which said at least one organic dielectric layer is of a material selected from the group of materials consisting of fiberglass-reinforced epoxy resin, polytetrafluoroethylene, polyimide, polyamide, cyanate resin, photo-imageable material and combinations thereof.

3. The circuitized substrate of claim 1 wherein said metallic component is selected from the group consisting of copper, silver, gold, zinc, cadmium, palladium, iridium, ruthenium, osmium, rhodium, platinum, iron, cobalt, nickel, indium, tin, antimony, lead, bismuth and alloys thereof.

4. The circuitized substrate of claim 1 wherein said quantity of solder is selected from the group consisting of tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

5. The circuitized substrate of claim 1 wherein said at least one opening is a thru-hole.

6. The circuitized substrate of claim 1 wherein said conductive paste is a low temperature conductive paste and said at least one dielectric layer is a high temperature dielectric.

7. The circuitized substrate of claim 1 further including at least one electrical component electrically coupled to said conductive paste, said circuitized substrate and said at least one electrical component forming an electrical assembly.

8. The circuitized substrate of claim 7 further including a housing, said electrical assembly being positioned within said housing, said housing and said electrical assembly forming an information handling system.

9. The circuitized substrate in accordance with claim 1, wherein said protective coating comprises at least one precious metal.

10. A circuitized substrate comprising:
first and second organic dielectric layers each having a first surface thereon, said first surface of said first organic dielectric layer facing said first surface of said second organic dielectric layer;
at least one electrical conductor positioned on each of said first surfaces of said first and second organic dielectric layers;
a quantity of conductive paste interconnecting said at least one electrical conductor on said first surface of said first organic dielectric layer to said at least one electrical conductor on said first surface of said second organic dielectric layer, said quantity of conductive paste including a fluxless binder component and at least one metallic component including a plurality of microparticles, selected ones of said microparticles of said metallic component including a quantity of solder thereon; and
a protective coating disposed over said solder for preventing oxidation thereof.

11. The circuitized substrate of claim 10 in which said at least one organic dielectric layer is of a material selected from the group of materials consisting of fiberglass-reinforced epoxy resin, polytetrafluoroethylene, polyimide, polyamide, cyanate resin, photo-imageable material and combinations thereof.

12. The circuitized substrate of claim 10 wherein said metallic component is selected from the group consisting of copper, silver, gold, zinc, cadmium, palladium, iridium, ruthenium, osmium, rhodium, platinum, iron, cobalt, nickel, indium, tin, antimony, lead, bismuth and alloys thereof.

13. The circuitized substrate of claim 10 wherein said quantity of solder is selected from the group consisting of tin-lead, bismuth- tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

14. The circuitized substrate of claim 10 wherein said conductive paste is a low temperature conductive paste and said at least one dielectric layer is a high temperature dielectric.

15. The circuitized substrate of claim 10 further including at least one electrical component electrically coupled to said conductive paste, said circuitized substrate and said at least one electrical component forming an electrical assembly.

16. The circuitized substrate of claim 15 further including a housing, said electrical assembly being positioned within said housing, said housing and said electrical assembly forming an information handling system.

17. The circuitized substrate in accordance with claim 10, wherein said protective coating comprises at least one precious metal.

18. A method of making a circuitized substrate, said method comprising:
providing at least one organic dielectric layer having first and second opposing surfaces;
forming at least one opening within said at least one organic dielectric layer extending from said first opposing surface to said second opposing surface;
positioning a quantity of conductive paste within said at least one opening, said quantity of conductive paste including a fluxless binder component and at least one metallic component including a plurality of microparticles, selected ones of said microparticles of said metallic component including a quantity of solder thereon; and
disposing a protective coating over said solder for preventing oxidation thereof.

19. The method of claim 18 wherein said forming of said at least one opening within said at least one organic dielectric layer is accomplished using laser or mechanical drilling.

20. The method of claim 18 wherein said positioning of said conductive paste within said at least one opening is accomplished using printing or needle dispensing.

21. The method of making a circuitized substrate in accordance with claim 18, wherein said protective coating comprises at least one precious metal.

22. A method of making a circuitized substrate, said method comprising:
providing first and second organic dielectric layers each having a first surface thereon;
forming at least one electrical conductor on each of said first surfaces of said first and second organic dielectric layers;
orienting said first and second dielectric layers such that said first surface of said first organic dielectric layer having at least one of said electrical conductors thereon faces said first surface of said second organic dielectric layer having at least one of said electrical conductors thereon;

positioning a quantity of conductive paste between said first and second organic dielectric layers to interconnect said at least one electrical conductor on said first surface of said first organic dielectric layer to said at least one electrical conductor on said first surface of said second organic dielectric layer, said quantity of conductive paste including a fluxless binder component and at least one metallic component including a plurality of microparticles, selected ones of said microparticles of said metallic component including a quantity of solder thereon; and disposing a protective coating over said solder for preventing oxidation thereof.

23. The method of claim 22 wherein said forming of said at least one electrical conductor on each of said first surfaces of said first and second organic dielectric layers is accomplished using photolithography processing.

24. The method of claim 22 wherein said positioning of said conductive paste within said at least one opening is accomplished using printing or needle dispensing.

25. The method of making a circuitized substrate in accordance with claim 22, wherein said protective coating comprises at least one precious metal.

26. A circuitized substrate comprising:
at least one organic dielectric layer having first and second opposing surfaces;
at least one opening within said at least one organic dielectric layer extending from said first opposing surface to said second opposing surface; and
a quantity of conductive paste positioned within said at least one opening, said quantity of conductive paste including a binder component and a plurality of nano-wires, selected ones of said nano-wires including a quantity of solder thereon.

27. The circuitized substrate of claim 26 wherein said at least one organic dielectric layer is of a material selected from the group of materials consisting of fiberglass-reinforced epoxy resin, polytetrafluoroethylene, polyimide, polyamide, cyanate resin, photo-imageable material and combinations thereof.

28. The circuitized substrate of claim 26 wherein said nano-wires are nano-tubes.

29. The circuitized substrate of claim 26 wherein said quantity of solder is selected from the group consisting of tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

30. The circuitized substrate of claim 26 wherein said at least one opening is a thru-hole.

31. The circuitized substrate of claim 26 wherein said conductive paste is a low temperature conductive paste and said at least one dielectric layer is a high temperature dielectric.

32. The circuitized substrate of claim 26 further including at least one electrical component electrically coupled to said conductive paste, said circuitized substrate and said at least one electrical component forming an electrical assembly.

33. The circuitized substrate of claim 32 further including a housing, said electrical assembly being positioned within said housing, said housing and said electrical assembly forming an information handling system.

34. A circuitized substrate comprising:
first and second organic dielectric layers each having a first surface thereon, said first surface of said first organic dielectric layer facing said first surface of said second organic dielectric layer;
at least one electrical conductor positioned on each of said first surfaces of said first and second organic dielectric layers; and
a quantity of conductive paste interconnecting said at least one electrical conductor on said first surface of said first organic dielectric layer to said at least one electrical conductor on said first surface of said second organic dielectric layer, said quantity of conductive paste including a binder component and a plurality of nano-wires, selected ones of said nano-wires including a quantity of solder thereon.

35. The circuitized substrate of claim 34 wherein said at least one organic dielectric layer is of a material selected from the group of materials consisting of fiberglass-reinforced epoxy resin, polytetrafluoroethylene, polyimide, polyamide, cyanate resin, photo-imageable material and combinations thereof.

36. The circuitized substrate of claim 34 wherein said quantity of solder is selected from the group consisting of tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

37. The circuitized substrate of claim 34 wherein said at least one opening is a thru-hole.

38. The circuitized substrate of claim 34 wherein said conductive paste is a low temperature conductive paste and said at least one dielectric layer is a high temperature dielectric.

39. The circuitized substrate of claim 34 further including at least one electrical component electrically coupled to said conductive paste, said circuitized substrate and said at least one electrical component forming an electrical assembly.

40. The circuitized substrate of claim 39 further including a housing, said electrical assembly being positioned within said housing, said housing and said electrical assembly forming an information handling system.

* * * * *